(12) United States Patent
Seo et al.

(10) Patent No.: US 7,245,896 B2
(45) Date of Patent: Jul. 17, 2007

(54) APPARATUS FOR IMPROVING RECEPTION SENSITIVITY OF PUBLIC WAVE RECEIVER BY REDUCING NOISE EXTERNALLY-EMITTED IN THE PUBLIC WAVE RECEIVER

(75) Inventors: Dong Han Seo, Gyeonggi-do (KR); Jong Woo Kim, Seoul (KR); Chan Tae Kim, Busan (KR); Oh Suk Kwon, Seoul (KR); Jae Geun Lee, Incheon-si (KR)

(73) Assignee: LG Electronics Inc., Seoul (KR)

( * ) Notice: Subject to any disclaimer, the term of this patent is extended or adjusted under 35 U.S.C. 154(b) by 576 days.

(21) Appl. No.: 10/600,526

(22) Filed: Jun. 23, 2003

(65) Prior Publication Data

US 2004/0014508 A1    Jan. 22, 2004

(30) Foreign Application Priority Data

Jun. 24, 2002 (KR) ............... 10-2002-0035466
Jul. 22, 2002 (KR) ............... 10-2002-0042990

(51) Int. Cl.
 *H04B 1/10* (2006.01)
 *H05K 4/20* (2006.01)

(52) U.S. Cl. ............ 455/300; 455/301; 174/377; 361/818; 363/16; 363/37

(58) Field of Classification Search ........ 361/816–820; 363/16, 21.01, 62, 21.07, 37; 455/300, 301; 174/377
See application file for complete search history.

(56) References Cited

U.S. PATENT DOCUMENTS

| | | | | |
|---|---|---|---|---|
| 5,482,898 A | * | 1/1996 | Marrs .................... | 29/827 |
| 5,541,811 A | * | 7/1996 | Henningsson et al. ...... | 361/704 |
| 5,559,501 A | * | 9/1996 | Barzegar et al. ............ | 340/825 |
| 5,625,535 A | * | 4/1997 | Hulsebosch et al. ........ | 361/719 |
| 5,802,484 A | * | 9/1998 | Hamilton et al. ........... | 455/558 |
| 5,847,938 A | * | 12/1998 | Gammon .................... | 361/816 |
| 6,195,267 B1 | * | 2/2001 | MacDonald et al. ........ | 361/800 |
| 6,195,540 B1 | * | 2/2001 | Ogino et al. ................ | 455/344 |
| 6,198,642 B1 | * | 3/2001 | Kociecki ..................... | 363/37 |
| 6,366,486 B1 | * | 4/2002 | Chen et al. ................. | 363/141 |
| 6,420,649 B1 | * | 7/2002 | Kahl et al. .................. | 174/377 |
| 6,525,946 B2 | * | 2/2003 | Tani et al. ............... | 363/21.07 |
| 6,556,456 B1 | * | 4/2003 | Takehara .................... | 361/818 |
| 6,582,785 B2 | * | 6/2003 | Nagata et al. ............. | 428/34.1 |
| 6,649,827 B2 | * | 11/2003 | West et al. ................. | 174/377 |
| 6,950,291 B1 | * | 9/2005 | Andres et al. ............... | 361/38 |

FOREIGN PATENT DOCUMENTS

| | | |
|---|---|---|
| JP | 01-245596 A | 9/1989 |
| JP | 10-290093 A | 10/1998 |
| JP | 00114852 A | 4/2000 |

* cited by examiner

*Primary Examiner*—Edward F. Urban
*Assistant Examiner*—Blane J. Jackson
(74) *Attorney, Agent, or Firm*—Birch, Stewart, Kolasch & Birch, LLP

(57) ABSTRACT

An apparatus for improving reception sensitivity of a public wave receiver includes power devices formed in a power supply of the public wave receiver, and a shielding plate for shielding noise generated by the power devices. A signal line for connecting an antenna used for the public wave receiver to a public wave receiver main body and a ground line are formed coaxially to each other by a shield layer.

16 Claims, 6 Drawing Sheets

APPARATUS FOR IMPROVING RECEPTION SENSITIVITY OF PUBLIC WAVE RECEIVER BY REDUCING NOISE EXTERNALLY-EMITTED IN THE PUBLIC WAVE RECEIVER

BACKGROUND OF THE INVENTION

1. Field of the Invention

The present invention relates to an apparatus for improving the reception sensitivity of a public wave receiver, and more particularly, to an apparatus for improving reception sensitivity of a public wave receiver by reducing noise externally-emitted in the public wave receiver, which generates serious noise due to switching operations of power devices built in a power supply of the receiver.

2. Brief Description of the Background Art

Recently, electronic digital products include special power supplies for stable and reliable supply of power. The power supply uses chip-type power devices for stably supplying power by switching operations in order to decrease the size and weight of the power supply.

An SMPS (Switched Mode Power Supply) can also be employed as the power supply.

FIG. 1 is a plan view illustrating the power supply where general power devices are mounted on a substrate, and FIG. 2 is a side view illustrating the power supply.

Referring to FIGS. 1 and 2, the power supply includes a substrate 1 on which various elements are mounted including power devices 3 for performing switching operations, and leads 4 extending from the side portions of the power devices 3 for mounting the power devices 3 on the substrate 1.

In order to stably supply power through the power supply, the power devices 3 perform the switching operations.

Switching noise is externally emitted due to the switching operations of the power devices 3, which influences the other components of an electronic apparatus main body on which the power supply is installed.

The emitted noise seriously generates failures in public wave reception of a public wave receiver. For example, the public wave receiver mistakenly recognizes a frequency interrupted by the emitted noise as the normal one during the AM/FM signal search. This is referred to as a noise stop phenomenon.

In addition, a switching frequency and/or multiplied frequency of the power devices 3 is transmitted to an antenna through an antenna connecting line, mingled with a reception frequency band, and operated as noise. It is thus impossible to receive normal public waves in a desired frequency band, which reduces reception sensitivity and generates noise.

FIG. 3 is a perspective view illustrating an antenna of the general public wave receiver.

As illustrated in FIG. 3, the antenna includes an antenna frame 5 generally formed in a rectangular shape, a wire winding unit forming the outer circumference of the antenna frame 5, and a wire 6 wound around the wire winding unit multiple times.

The antenna further includes a connecting wire 7 with one side connected to the wire 6 and the other side connected to a public wave receiver main body. The connecting wire 7 serves to transmit public wave signals from the wire 6 to the public wave receiver main body. The connecting wire 7 has a signal line 8 for transmitting the signals and a ground line 9 for grounding, which are separately formed and twisted with each other.

The antenna of the general public wave receiver is connected to the public wave receiver main body through the connecting wire 7, and the antenna frame 5 is properly positioned for public wave reception.

However, the switching frequency and/or multiplied frequency generated by the power devices (3 of FIG. 1) is mingled with the frequency band which the antenna intends to receive, and produces noise. Therefore, public wave reception of a wanted frequency band is not performed, or reception sensitivity thereof is reduced.

For example, the power devices 3 may have a switching frequency of 375 KHz in the public wave receiver receiving AM signals whose frequency band ranges from 540 to 1600 KHz. Here, the switching frequency generated by the power devices 3 is transmitted to the connecting wire 7 of the antenna, and thus produces noise in the AM signals received by the pubic wave receiver. As a result, normal frequency reception is impossible.

Moreover, the signal line 8 and the ground line 9 of the connecting wire 7 are twisted with each other, which is not attractive. In addition, the whole shape of the connecting wire 7 may be deformed due to an untwisting force of the twisted signal line 8 and ground line 9.

SUMMARY OF THE INVENTION

An object of the invention is to solve at least the above problems and/or disadvantages and to provide at least the advantages described hereinafter.

Accordingly, one object of the present invention is to solve the foregoing problems by preventing external emission of noise generated by power devices so as to improve reception sensitivity of a public wave receiver.

Another object of the present invention is to provide an antenna which is not influenced by noise generated by a public wave receiver in order to improve reception sensitivity of the receiver.

The foregoing and other objects and advantages are realized by providing an apparatus for improving reception sensitivity of a public wave receiver, including: a substrate formed in a power supply; at least one power device mounted on the substrate of the power supply, for supplying power by a switching operation; and a shielding plate being composed of a conductive material, including a shielding surface for shielding the top surfaces of the power devices, and mounting legs extended from the bottom surface of the shielding surface and mounted on the substrate, and preventing external transmission of noise generated by the power devices.

According to another aspect of the invention, an apparatus for improving reception sensitivity of a public wave receiver includes: a wire for receiving public waves; an antenna frame, a wire winding unit around which the wire is wound; and a connecting wire having both ends electrically connected to the wire and the public wave receiver respectively, and including a signal line through which the public waves received by the wire are transmitted, and a ground line formed coaxially to the signal line, with contact surfaces between the ground line and the signal line being insulated from each other by a shield layer.

According to another aspect of the invention, an apparatus for improving reception sensitivity of a public wave receiver includes: a power device for performing a switching operation to stably supply power to the public wave receiver; shielding means for shielding noise generated by the power device; cooling means for lowering a high temperature due to the shielding means; and noise intercepting means for preventing noise from being transmitted to an antenna.

According to the present invention, noise generated by the power devices of the power supply is prevented from being transmitted through the connecting wire, especially the signal line, to receive reliable high quality signals.

In addition, the power devices generating switching noise can be stably used in the power supply of the public wave receiver, thereby relatively reducing a size and weight of the power supply for miniaturization.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The following detailed description will present an apparatus for improving reception sensitivity of a public wave receiver according to a preferred embodiment of the invention with reference to the accompanying drawings.

Figure 1:
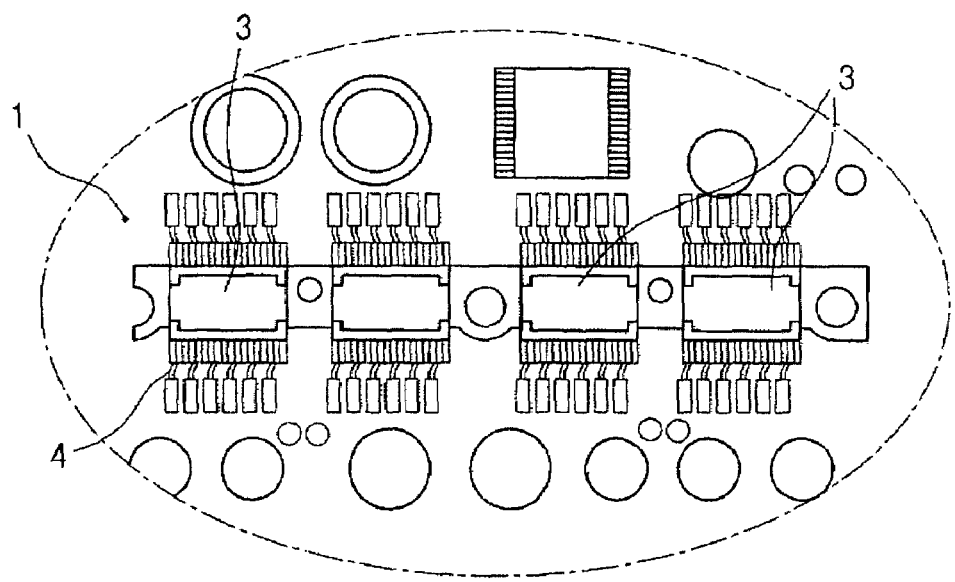
FIG. 1 is a plan view illustrating a background art power supply where general power devices are mounted on a substrate.
Figure 2:
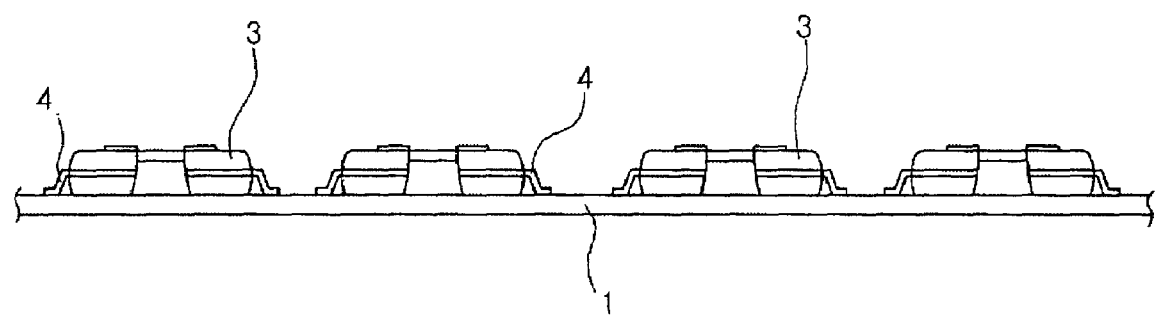
FIG. 2 is a side view illustrating the background art power supply where the general power devices are mounted on the substrate.
Figure 3:
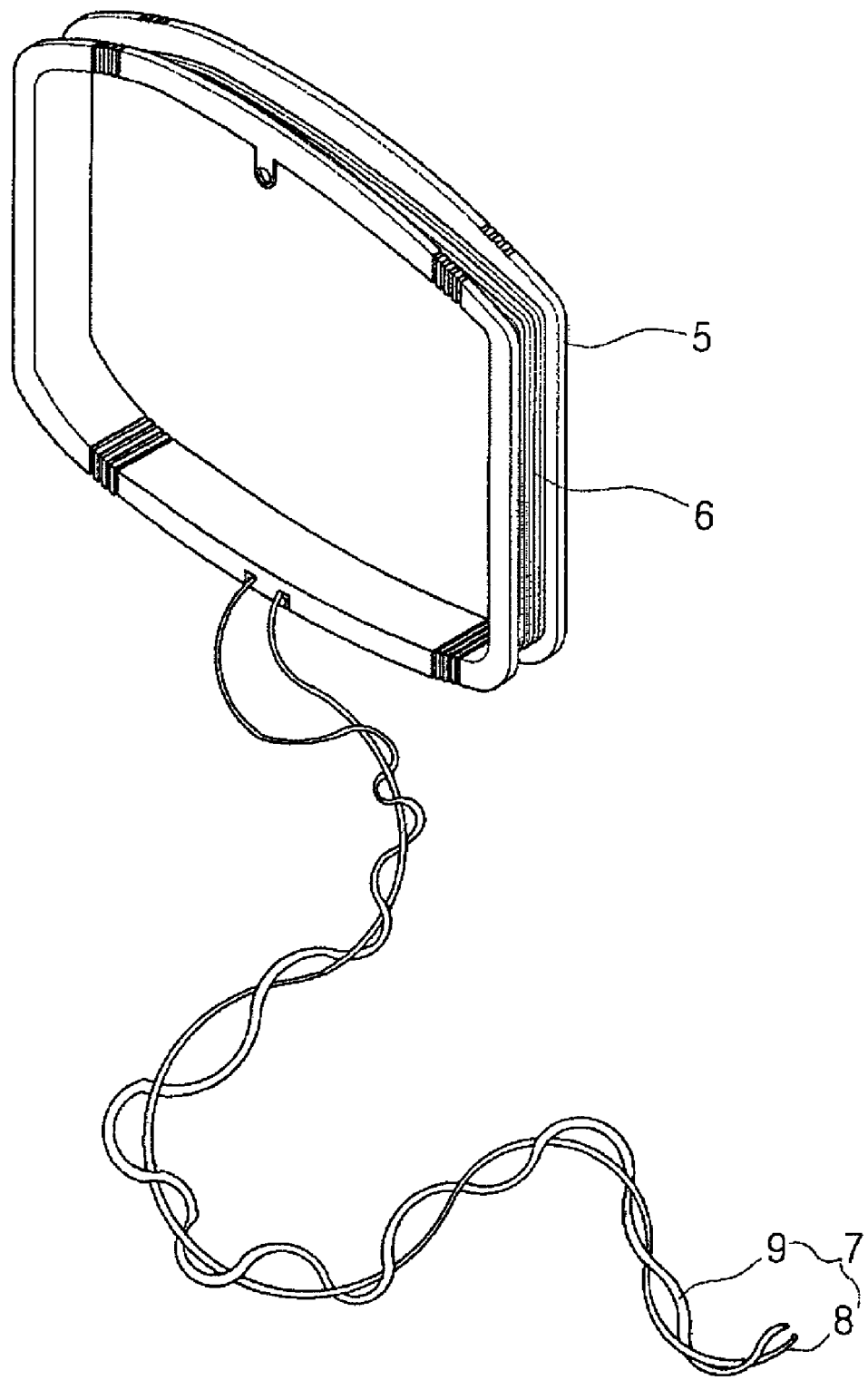
FIG. 3 is a perspective view illustrating a background art antenna of a public wave receiver.
Figure 4:
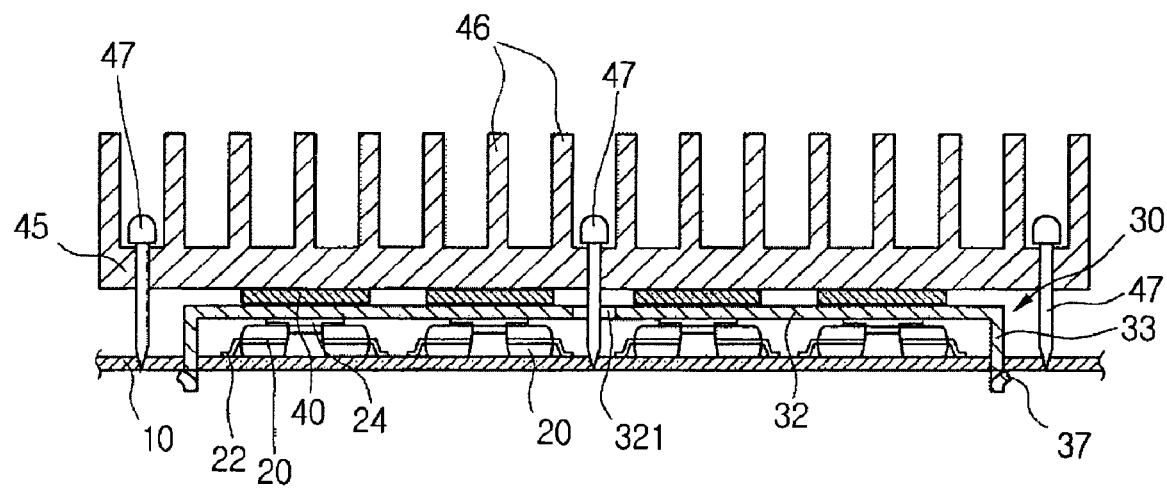
FIG. 4 is a cross-sectional view illustrating a power device installation part of an apparatus for improving reception sensitivity of a public wave receiver in accordance with a preferred embodiment of the present invention.
Figure 5:
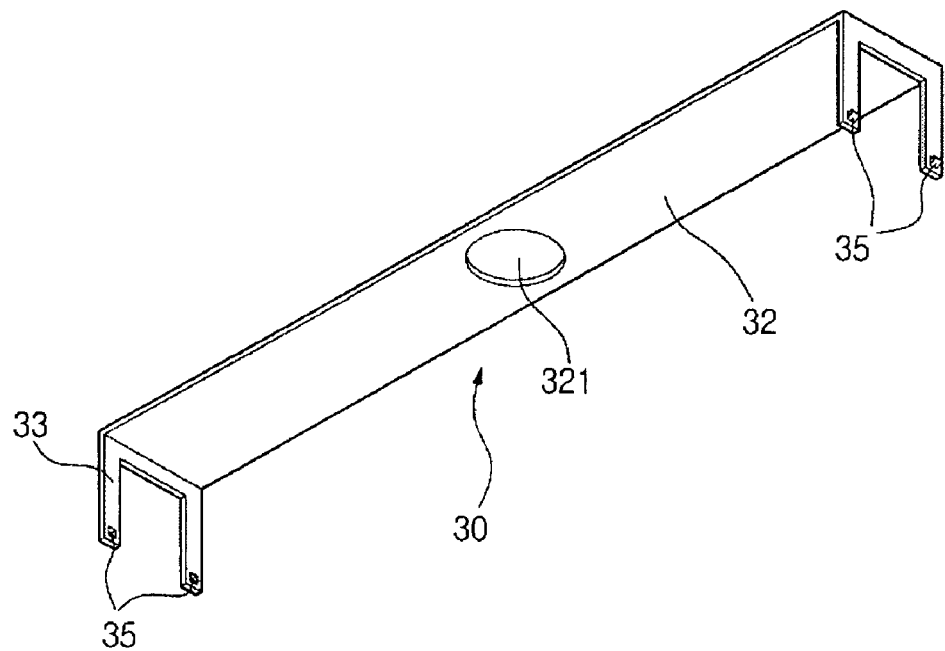
FIG. 5 is a bottom perspective view illustrating a shielding plate in accordance with the preferred embodiment of the present invention.
Figure 6:
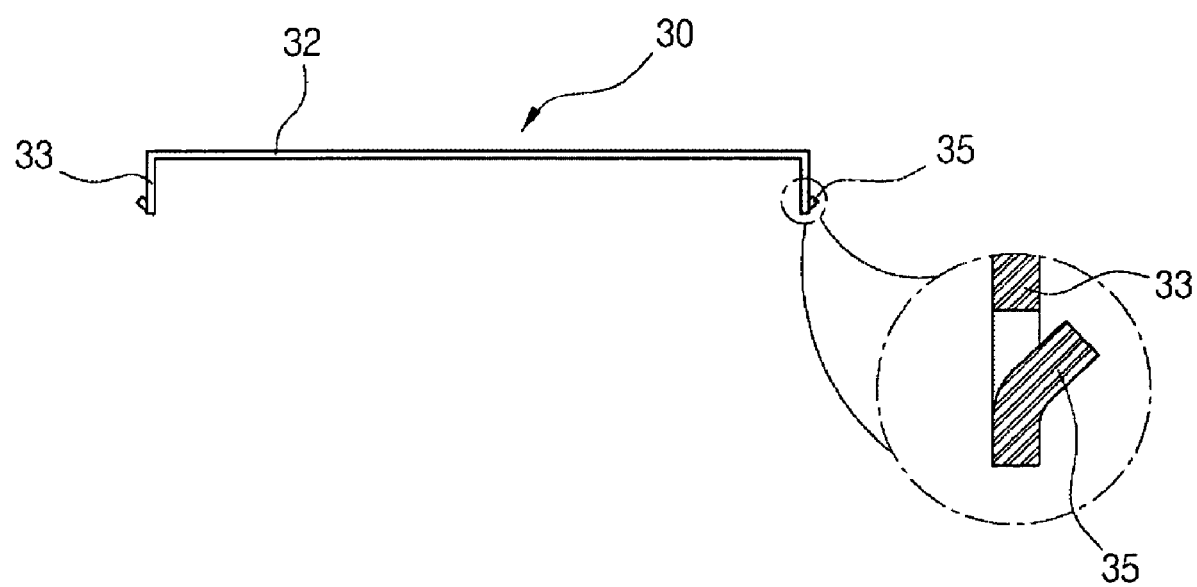
FIG. 6 is a cross-sectional view illustrating the shielding plate in accordance with the preferred embodiment of the present invention.

FIGS. 4 to 6 show the constitution of a power device installation part in the apparatus for improving reception sensitivity of the public wave receiver in accordance with the present invention.

As illustrated in FIGS. 4 to 6, the apparatus for improving reception sensitivity of the public wave receiver includes a substrate 10 of a power supply, heat emission conductors 24 for rapidly conducting heat generated in power devices 20, a shielding plate 30 for shielding the top surfaces of the power devices 20, adhering members 40 for surface-contacting the top surface of the shielding plate 30, and a heat sink 45 for surface-contacting the top surfaces of the adhering members 40, and for dissapating heat which is generated and conducted by the power devices 20.

The number of power devices 20 is determined according to the particular power supply. Leads 22 are positioned at both side portions of the power devices 20, for mounting the power devices 20 on the substrate 10 and electrically connecting them to the other components. In addition, the power devices 20 further include the heat emission conductors 24 for rapidly conducting heat generated during the operation of the power devices 20. The heat emission conductors 24 can be positioned at the top surfaces of the power devices 20 and/or both side portions of the power devices 20 where the leads 22 are not formed. The shielding plate 30 includes a shielding surface 32. If the power devices 20 and the shielding surface 32 smoothly surface-contact one another, the heat emission conductors 24 can be omitted.

The shielding surface 32 shields the top surfaces of the power devices 20. Here, the shielding surface 32 is formed in a rectangular shape to simultaneously shield the top surfaces of the power devices 20 aligned in a row. However, other shapes are contemplated, such as circular or square, depending on the arrangement of the power devices 20. Preferably, the shielding surface 32 contacts the top surfaces of the power devices 20, and is composed of a highly conductive metal material for allowing rapid heat transfer. Reference numeral 321 denotes a screw hole through which a mounting screw 47 passes.

A pair of mounting legs 33 are formed at both ends of the shielding plate 30. The mounting legs 33 are curved and extend from the bottom surface of the shielding surface 32. In addition, a height of the mounting legs 33 is equal to or larger than the height of the power devices 20.

Hooking strips 35 are formed at the ends of the mounting legs 33. The hooking strips 35 are formed by cutting predetermined portions of the mounting legs 33 and curving them to the outside to form a barb. The ends of the hooking strips 35 are curved in the opposite direction to the extended mounting legs 33.

The ends of the hooking strips 35 are hooked on the bottom surface of the substrate 10 on which the shielding plate 30 is mounted, for fixing the shielding plate 30 to the substrate 10. In addition, the mounting legs 33 are soldered on the substrate 10 for electrical grounding. Reference numeral 37 denotes soldering units.

The adhering members 40 serve to adhere the shielding surface 32 to the bottom surface of the heat sink 45. For this, the adhering members 40 are preferably composed of elastic and conductive materials.

A plurality of radiating fins 46 are formed on the heat sink 45. The radiating fins 46 facilitate heat emission by increasing a surface contact area exposed to air. An end direction length of the heat sink 45 is relatively larger than that of the shielding plate 30, for rapidly emitting heat. Preferably, an area of the bottom surface of the heat sink 45 is larger than that of the shielding surface 32 of the shielding plate 30. However, in order to prevent excessive increase in size of the power supply, a space of the substrate 10 occupied by the heat sink 45 must be restricted.

The heat sink 45 is mounted on the substrate 10 by mounting screws 47. The mounting screws 47 are passed through the heat sink 45 at the middle and both end portions of the heat sink 45, and fastened to the substrate 10. Especially, the mounting screw 47 inserted into the middle portion of the heat sink 45 is inserted the screw through hole 321 formed through the shielding plate 30.

The operations and effects of the power device installation part of the apparatus for improving reception sensitivity of the public wave receiver in accordance with the present invention will now be explained in detail.

The assembly process of the power devices will now be described. In a state where the power devices 20 are mounted on the substrate 10, the shielding plate 30 is provisionally installed on the substrate 10. For this, the mounting legs 33 are inserted into the previously-formed through holes of the substrate 10. When the mounting legs 33 are inserted into the through holes of the substrate 10, the hooking strips 35 are elastically deformed to be almost parallel to the mounting legs 33, and restored to the original state after passing through the through holes. Here, the hooking strips 35 are hooked on the bottom surface (opposite to the surface on which the power devices 20 are mounted) of the substrate 10. Accordingly, the mounting legs 33 do not come out of the substrate 10 due to the hooking strips 35. After the shielding plate 30 is provisionally assembled, the hooking strips 35 are soldered by the soldering units.

When the shielding plate 30 is coupled to the substrate 10, the shielding surface 32 contacts the top surfaces of the power devices 20.

Since the soldering units 37 are electrically connected to the ground part of the substrate 10, the shielding plate 30 grounds and emits static electricity which may be transmitted to the power devices 20. Moreover, noise generated by the power devices 20 is absorbed and emitted by the shielding plate 30.

Therefore, the power devices 20 can be stabilized without being influenced by static electricity, and noise generated by the power devices 20 is not externally transmitted, especially to an antenna receiving public waves.

Thereafter, the adhering members 40 are positioned on the top surface of the shielding plate 30, and the heat sink 45 is fastened to the substrate 10 by the mounting screws 47. When the mounting screws 47 are being fastened, the shielding surface 32 of the shielding plate 30 and the bottom surface of the heat sink 45 are firmly adhered to the adhering members 40 due to the fastening force of the mounting screws 47. That is, heat transmission between the shielding plate 30 and the heat sink 45 can be smoothly performed due to adhesion increased by the adhering members 40.

The shielding plate 30 is composed of a conductive material, such as metal, for shielding noise generated by the power devices 20. Accordingly, noise generated by the power devices 20 is prevented from being externally emitted, to improve performance of the public wave receiver using the power devices, especially the performance of the antenna.

On the other hand, when the mounting legs 33 pass through the through holes of the substrate 10, the ends of the hooking strips 35 formed on the mounting legs 33 of the shielding plate 30 are adhered to the bottom surface of the substrate 10, to prevent the shielding plate 30 from being separated from the substrate 10. In addition, the hooking strips 35 aid in positioning molten solder during the soldering process between the mounting legs 33 and the substrate 10 for precise soldering.

In general, the shielding plate 30 shields the top surfaces of the power devices 20, and thus heat generated by the power devices 20 cannot smoothly contact external air. However, in accordance with the present invention, the adhering members 40 are positioned between the shielding plate 30 and the heat sink 45, and thus heat generated by the power devices 20 can be easily externally emitted.

The apparatus for improving reception sensitivity of the public wave receiver shields the top surfaces of the power devices with the shielding surface of the shielding plate, to prevent external emission of noise generated by the power devices. As a result, performance of the equipment using the power devices improves. Especially, noise transmission to the antenna side is restricted so as to not influence public wave reception.

Moreover, the heat sink is installed in the shielding plate so as to emit heat generated by the power devices, and thus the power devices are always operated in the optimal conditions, which improves operation reliability.

The apparatus for improving reception sensitivity of the public wave receiver is applied to the public wave receiver to improve signal reception sensitivity. In addition, it can be applied to any other equipment using power devices performing switching operations. It also can reduce the influence of noise generated by the power devices on the other components of an electronic apparatus.

Figure 7:
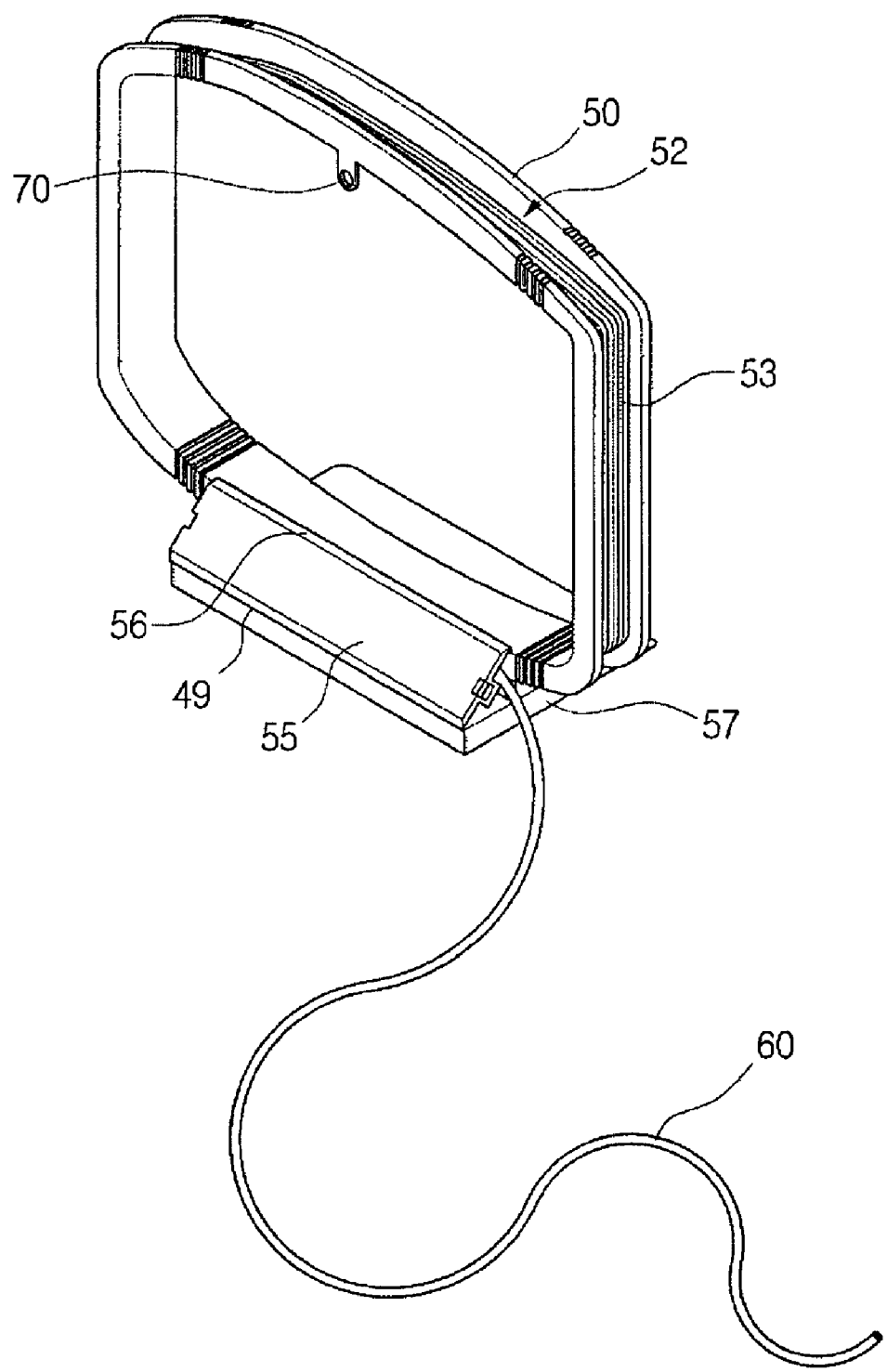
FIG. 7 is a perspective view illustrating an antenna part of the apparatus for improving reception sensitivity of the public wave receiver in accordance with the preferred embodiment of the present invention.
Figure 8:
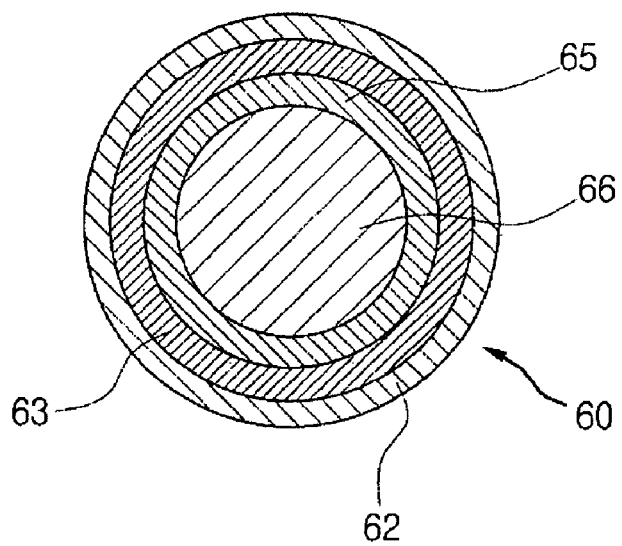
FIG. 8 is a cross-sectional view illustrating a connecting wire in accordance with the preferred embodiment of the present invention.
Figure 9:
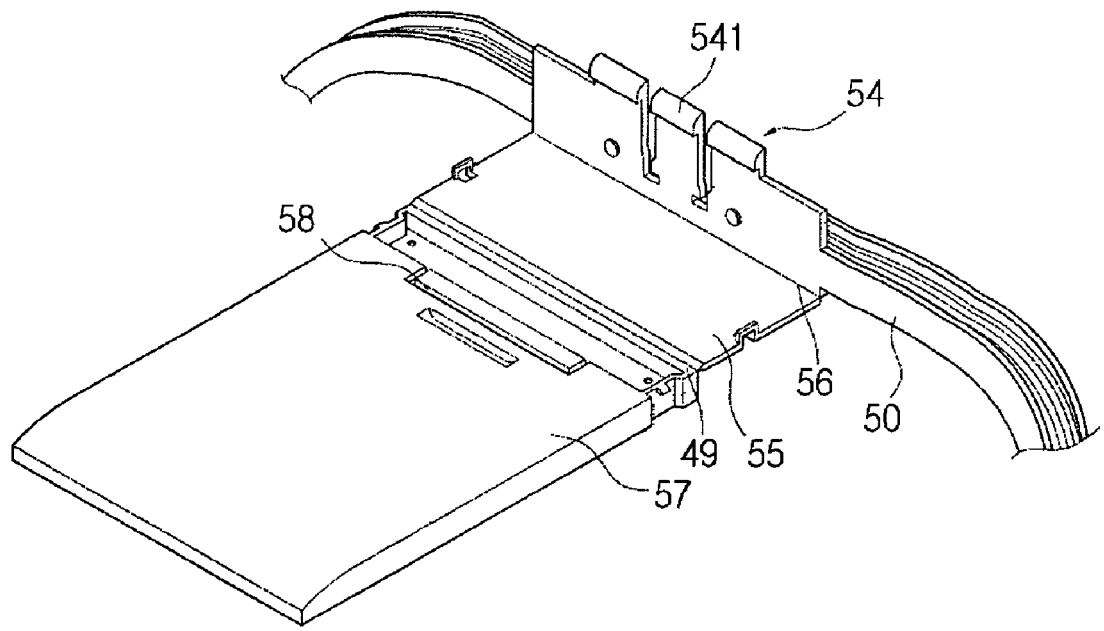
FIG. 9 is a detailed structure view illustrating a supporting unit of an antenna frame in accordance with the preferred embodiment of the present invention.

FIGS. 7, 8 and 9 show the constitution of an antenna part of the apparatus for improving reception sensitivity of the public wave receiver in accordance with the present invention.

Referring to FIG. 7, the antenna part of the public wave receiver includes an antenna frame 50 composed of a molded material in a closed loop shape, a wire winding unit 52 composing the outer circumference of the antenna frame 50, a wire 53 wound around the wire winding unit 52, and a connecting wire 60 having one end electrically connected to the wire 53 and the other end electrically connected to a public wave receiver main body (not shown). Reference numeral 70 denotes hooking strips for hooking the antenna frame 50 on the wall.

In more detail, as shown in FIG. 9, a hooking protrusion 54 is formed along one side of the antenna frame 50, and inserted into a hooking slot 58 of a supporting plate 57 which will later be explained. Hooking jaws 541 are formed at the end of the hooking protrusion 54 to prevent the hooking protrusion 54 from being separated from the hooking slot 58.

A connecting plate 55 is extended from one side of the antenna frame 50. The connecting plate 55 is connected to the antenna frame 50 by a first molded neck 56. The first molded neck 56 connecting the antenna frame 50 to the connecting plate 55 is formed relatively thin to be freely folded. The first molded neck 56 is preferably incorporated with the antenna fame 50 in production. Accordingly, the connecting plate 55 can be rotated at a predetermined angle around the antenna frame 50.

The supporting plate 57 connected to a second molded neck 49 in the opposite direction to the first molded neck 56 is incorporated with the connecting plate 55. Therefore, the supporting plate 57 can be rotated at a predetermined angle around the second mold neck 49. The formation and operation of the second the connecting plate by neck 49 is identical to the first molded neck 56, and thus detailed explanations thereof will be omitted.

The supporting plate 57 is formed in a plate shape with a predetermined area, for supporting the antenna frame 50 as shown in FIG. 7. As depicted in FIG. 9, the hooking slot 58 is longitudinally formed at one end portion of the supporting plate 57. The hooking protrusion 54 is inserted into the hooking slot 58, for maintaining the folded states of the connecting plate 55 and the supporting plate 57 which are incorporated with the antenna frame 50 as shown in FIG. 7.

On the other hand, as illustrated in FIG. 8, both side portions of the connecting wire 60 are connected to the wire 53 wound around the antenna frame 50 and the public wave receiver main body, for electrically connecting the wire 53 to the public wave receiver.

The structure of the connecting wire 60 will now be explained in detail, with reference to FIG. 8. The connecting wire 60 includes an external shield layer 62 formed at the most external portion, a ground line 63 formed in the external shield layer 62, an internal shield layer 65 formed in the ground line 63, and a signal line 66 formed in the internal shield layer 65.

Preferably, the external shield layer 62 and the internal shield layer 65 are composed of insulating materials, and the ground line 63 is formed coaxially to the external shield layer 62.

The internal shield layer 65 is also formed coaxially to the ground line 63 and the external shield layer 62. In addition, the signal line 66 is formed coaxially to the ground line 63, the external shield layer 62 and the internal shield layer 65.

The operations and effects of the antenna part of the apparatus for improving reception sensitivity of the public wave receiver in accordance with the present invention will now be described.

In this embodiment, the antenna part is used for public wave reception, especially effective when switching noise is seriously generated by the power devices for performing the switching operations in the public wave receiver.

In general, the antenna part is installed separately from the public wave receiver, for receiving certain band public wave signals. Here, the received signals are transmitted to the public wave receiver through the connecting wire 60. However, the connecting wire 60 is essentially electrically connected to the equipment, and thus exposed to noise generated by the public wave receiver. Especially, noise generated due to the switching operations of the power devices (20 of FIG. 4) is transmitted to the connecting wire 60.

However, in this embodiment, a shielding property between the signal line 66 and the outside improves by the internal shield layer 65 and/or the external shield layer 62, thereby preventing noise transfer to the signal line 66. In addition, the internal shield layer 65 is formed between the signal line 66 and the ground line 63 of the connecting wire 60, and thus signal transmission is not performed therebetween. Therefore, noise transmitted from the power devices 20 through the ground line 63 is prevented from going to the signal line 66.

As described above, since the signal line 66 electrically connected to the public wave receiver for transmitting signals to the public wave receiver is not influenced by peripheral noise, the antenna can receive signals of a wanted frequency band without noise.

On the other hand, the supporting plate 57 is incorporated with the antenna frame 50 through the connecting plate 55. In addition, because the connecting plate 55, the antenna frame 50 and the supporting plate 57 are connected through the first and second molded necks 56 and 49, the state of FIG. 9 where the connecting plate 55 and the supporting plate 57 are extended in a straight line can be converted into the state of FIG. 7.

That is to say, in the state of FIG. 9, the connecting plate 55 is folded at a predetermined angle around the first molded neck 56, and the supporting plate 57 is folded at a predetermined angle around the second molded neck 49. When the supporting plate 57 is folded over a predetermined angle, the hooking protrusion 54 of the antenna frame 50 is inserted into the hooking slot 58 of the supporting plate 57.

When the hooking protrusion 54 is inserted into the hooking slot 58 of the supporting plate 57 and the hooking jaws 541 are hooked inside the hooking slot 58, the supporting plate 57 corresponds to the bottom surface of the antenna frame 50 as shown in FIG. 7.

In this state, when the supporting plate 57 is fixed in a specific position, the antenna frame 50 can be installed as shown in FIG. 7.

On the other hand, instead of folding the supporting plate 57 as shown in FIG. 7, the hooking strips 70 can be hooked on the wall to install the antenna frame 50.

In this embodiment, noise generated by the power devices is prevented from being transmitted through the connecting wire, especially the signal line, to receive a reliable frequency.

In addition, the power devices generating switching noise can be stably used in the power supply of the public wave receiver, thereby relatively reducing a size and weight of the power supply for miniaturization.

In the case where the power device installation part and the antenna part are separately used in the apparatus for improving reception sensitivity of the public wave receiver, sensitivity of reception signals is reduced. However, it is possible to individually use them.

While the invention has been shown and described with reference to a certain preferred embodiment thereof, it will be understood by those skilled in the art that various changes in form and details may be made therein without departing from the spirit and scope of the invention as defined by the appended claims.

The foregoing embodiment and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus for improving reception sensitivity of a public wave receiver, comprising:
    a substrate formed in a power supply of the public wave receiver;
    at least one power device mounted on the substrate of the power supply, for supplying power by a switching operation; and
    a conductive shielding plate for preventing external transmission of noise generated by the at least one power device, the conductive shielding plate including a shielding surface for shielding a top surfaces of the at least one power device, and mounting legs extending from the shielding surface and mounted on the substrate.

2. The apparatus of claim 1, wherein the shielding surface is rectangular to shield top surfaces of a plurality of power devices at the same time.

3. The apparatus of claim 1, wherein the mounting legs are curved and extend from a bottom surface of the shielding surface.

4. The apparatus of claim 1, wherein the mounting legs include hooking strips for hooking the shielding plate on a bottom surface of the substrate.

5. The apparatus of claim 1, further comprising a heat sink located on a top surface of the shielding surface for emitting heat generated by the at least one power device.

6. The apparatus of claim 5, wherein a bottom surface of the heat sink is wider than the shielding surface.

7. The apparatus of claim 5, further comprising mounting screws having their ends positioned in the heat sink and the substrate for fixing the heat sink to the substrate.

8. The apparatus of claim 5, further comprising adhering members positioned between the heat sink and the shielding surface for conducting heat of the shielding plate to the heat sink, and for adhering the heat sink to the shielding surface.

9. The apparatus of claim 1, wherein soldering units are formed at contact portions of the substrate and the mounting legs, for dispersing signals transmitted to the mounting legs.

10. The apparatus of claim 1, further comprising a connecting wire including a signal line for transmitting signals received by a wire of an antenna to the public wave receiver, and a ground line formed coaxially to the signal line, wherein contact surfaces between the ground line and the signal line are insulated from each other by a shield layer.

11. An apparatus for improving reception sensitivity of a public wave receiver, comprising:
   power switching means for performing a switching operation to stably supply power to the public wave receiver;
   shielding means for shielding noise generated by the power switching means;
   cooling means for lowering a temperature of the power switching means; and
   noise intercepting means for preventing noise from being transmitted to antenna means connected to the public wave receiver,
   wherein the shielding means comprises a shielding plate located between the power switching means and the cooling means.

12. The apparatus of claim 11, wherein the cooling means comprises a heat sink having a plurality of fins.

13. The apparatus of claim 11, wherein the noise intercepting means comprises a connecting wire including a signal line, a ground line, and a shield layer composed of an insulating material formed between the signal line and the ground line.

14. An apparatus for improving reception sensitivity of a public wave receiver, comprising:
   power switching means for performing a switching operation to stably supply power to the public wave receiver;
   shielding means for shielding noise generated by the power switching means;
   cooling means for lowering a temperature of the power switching means; and
   noise intercepting means for preventing noise from being transmitted to antenna means connected to the public wave receiver,
   wherein the cooling means comprises a heat sink having a plurality of fins.

15. The apparatus of claim 14, wherein the noise intercepting means comprises a connecting wire including a signal line, a ground line, and a shield layer composed of an insulating material formed between the signal line and the ground line, and
   wherein the shielding means comprises a shielding plate located between the power shielding means and the cooling means.

16. The apparatus of claim 14, wherein the noise intercepting means comprises a connecting wire including a signal line, a ground line, and a shield layer composed of an insulating material formed between the signal line and the ground line.

* * * * *